US011757241B2

(12) United States Patent
Liao

(10) Patent No.: US 11,757,241 B2
(45) Date of Patent: Sep. 12, 2023

(54) POWER ADAPTER WITH PROTECTIVE SHIELD

(71) Applicant: GUANGDONG GOPOD GROUP HOLDING CO., LTD., Shenzhen (CN)

(72) Inventor: Zhuowen Liao, Shenzhen (CN)

(73) Assignee: GUANGDONG GOPOD GROUP HOLDING CO., LTD., Shenzhen (CN)

( * ) Notice: Subject to any disclaimer, the term of this patent is extended or adjusted under 35 U.S.C. 154(b) by 0 days.

(21) Appl. No.: 16/760,408

(22) PCT Filed: Mar. 18, 2020

(86) PCT No.: PCT/CN2020/079926
§ 371 (c)(1),
(2) Date: Apr. 29, 2020

(87) PCT Pub. No.: WO2021/184241
PCT Pub. Date: Sep. 23, 2021

(65) Prior Publication Data
US 2022/0416490 A1 Dec. 29, 2022

(51) Int. Cl.
*H01R 31/06* (2006.01)
*H01R 13/502* (2006.01)
(Continued)

(52) U.S. Cl.
CPC ......... *H01R 31/065* (2013.01); *H01R 13/502* (2013.01); *H05K 5/0247* (2013.01); *H05K 5/0039* (2013.01)

(58) Field of Classification Search
CPC .... H01R 31/065; H01R 13/502; H01R 27/02; H01R 35/025; H05K 5/0247; H05K 5/0039
See application file for complete search history.

(56) References Cited

U.S. PATENT DOCUMENTS 6,411,514 B1 6/2002 Hussaini
7,118,399 B1 10/2006 Wen et al.
(Continued)

FOREIGN PATENT DOCUMENTS

CN 107147276 A 9/2017
CN 209913720 U 1/2020

OTHER PUBLICATIONS

U.S. Appl. No. 16/760,404, filed Apr. 29, 2020, Liao.

*Primary Examiner* — Abdullah A Riyami
*Assistant Examiner* — Nader J Alhawamdeh

(57) ABSTRACT

In an example embodiment a power adapter includes a shell, a plug assembly, an electronic assembly and a protective shield, wherein the plug assembly comprises a plug and a connector electrically connected to the plug. The electronic assembly comprises a transformer and an electronic element; and the protective shield is located inside a receiving cavity and encloses a protective cavity together with a cavity wall of the receiving cavity, the connector is located inside the protective cavity, the electronic assembly is located outside the protective cavity, and the protective shield is a protective shield made of an insulating material. The power adapter reduces the influence of strong electrical interference generated by the connector on the electronic assembly, so that the space in the receiving cavity can be fully utilized, thereby realizing the small volume setting of the shell.

15 Claims, 4 Drawing Sheets

(51) Int. Cl.
    *H05K 5/02*       (2006.01)
    *H05K 5/00*       (2006.01)

(56) References Cited

U.S. PATENT DOCUMENTS

| | | | |
|---|---|---|---|
| 7,978,489 B1 * | 7/2011 | Telefus | H01R 31/065 363/142 |
| 8,790,124 B2 * | 7/2014 | Lee | H01R 31/06 439/131 |
| 9,728,906 B2 * | 8/2017 | Colahan | H02M 7/003 |
| 11,317,544 B1 | 4/2022 | Zeng | |
| 2004/0144527 A1 | 7/2004 | Yang et al. | |
| 2014/0308853 A1 * | 10/2014 | Colahan | H02M 7/003 439/628 |
| 2016/0276783 A1 * | 9/2016 | Colahan | H01R 13/6675 |
| 2018/0013229 A1 | 1/2018 | Goulden et al. | |
| 2019/0341714 A1 | 11/2019 | Du et al. | |
| 2020/0021065 A1 | 1/2020 | Chu et al. | |
| 2020/0235538 A1 * | 7/2020 | Liao | H01R 31/02 |
| 2020/0244021 A1 | 7/2020 | Liao | |
| 2021/0265849 A1 * | 8/2021 | Liao | H02J 7/02 |
| 2022/0173561 A1 | 6/2022 | Jang et al. | |
| 2022/0256733 A1 | 8/2022 | Wu et al. | |
| 2022/0263329 A1 | 8/2022 | Wei et al. | |
| 2022/0360034 A1 | 11/2022 | Liao | |
| 2022/0416489 A1 * | 12/2022 | Liao | H01R 24/60 |
| 2022/0416490 A1 * | 12/2022 | Liao | H05K 5/0247 |

* cited by examiner

POWER ADAPTER WITH PROTECTIVE SHIELD

RELATED APPLICATION(S)

This application is a National Stage application of International Application No. PCT/CN20201079926 filed Mar. 18, 2020. The aforementioned application is incorporated herein by reference, in its entirety, for any purposes.

TECHNICAL FIELD

The present application belongs to the technical field of charging devices, and particularly relates to a power adapter.

BACKGROUND OF THE INVENTION

The power adapter is a power supply conversion device for a small portable electronic device and an electronic appliance, and can convert the strong AC current input into weak DC current output. Inside a housing of a common power adapter on the market are generally equipped with electronic means such as a transformer, an inductor, a capacitor, a control chip, and a circuit board; since a plug of the power adapter is connected with strong AC current, strong electrical interference will occur near the plug; and the electronic means inside the housing needs to be separated from the plug by a large distance to be shielded from the strong electrical interference, but this results in a cavity inside the housing, causing the housing of the power adapter to be too large in volume and inconvenient to use.

SUMMARY OF THE INVENTION

Technical Problem

An object of the present application is to provide a power adapter, which aims to solve the technical problem that the volume of the power adapter in the prior art is too large that same is inconvenient to use.

Solution to Problem

Technical Solution present application is implemented by a power adapter, which comprises:

a shell, having a receiving cavity;

a plug assembly, comprising a plug connected to the shell and located outside the receiving cavity, and a connector electrically connected to the plug and located inside the receiving cavity;

an electronic assembly, comprising a transformer connected to the shell and located inside the receiving cavity, and an electronic element electrically connected to the transformer, wherein the transformer is electrically connected to the connector and used to convert strong current conducted by the connector into weak current to transmit same to the electronic element; and a protective shield, located inside the receiving cavity and enclosing a protective cavity together with a cavity wall of the receiving cavity, wherein the connector is located inside the protective cavity, the electronic assembly is located outside the protective cavity, and the protective shield is a protective shield made of an insulating material.

In one of the embodiments, the protective shield is a protective shield made of a plastic material.

In one of the embodiments, the receiving cavity is divided into a first chamber and a second chamber by the protective shield, a plurality of electronic elements are provided, and the first chamber and the second chamber are both provided with the electronic elements.

In one of the embodiments, the electronic element comprises at least one of a capacitor, an inductor and a control chip.

In one of the embodiments, the plug assembly further comprises a mount connected to the shell, the connector and the plug are respectively disposed on both sides of the mount, and the plug is rotatably connected to the mount.

In one of the embodiments, the mount is detachably connected to the shell.

In one of the embodiments, an avoidance groove is formed on an outer wall of the mount, an adapter block is arranged on a groove wall of the avoidance groove in a protruding manner, and the plug is rotatably connected to the adapter block and can be accommodated inside the avoidance groove by means of rotation.

In one of the embodiments, the shell is provided with a plug hole directly facing the connector and penetrating to the protective cavity, the protective shield is circumferentially provided in the plug hole, and the plug hole is used for an external power interface to pass through to electrically connect to the connector.

In one of the embodiments, the connector comprises an elastic assembly capable of being elastically deformed, the elastic assembly comprises at least two plug elastic pieces, and the plug elastic pieces are used for being elastically plugged by an external power connector.

In one of the embodiments, the protective shield comprises a cylindrical protective shell and a barrier connected to the protective shell, two extended ends of the protective shell are respectively connected to the mount and the cavity wall of the receiving cavity opposite the mount, the protective shell together with the mount and the cavity wall of the receiving cavity encloses the protective cavity, the barrier is located inside the protective cavity and divides the protective cavity into at least two partitioned cavities, and one of the plug elastic pieces is located in one of the partitioned cavities.

In one of the embodiments, the plug hole is a two-phase plug hole or a three-phase plug hole.

In one of the embodiments, the power adapter further comprises an interface socket connected to the shell and located inside the receiving cavity, the interface socket is electrically connected to the electronic element, the shell is further provided with an interface hole directly facing the interface socket, and the interface hole is used for an external data cable connector to pass through such that same is electrically plugged into the interface socket.

In one of the embodiments, a plurality of interface sockets and a plurality of interface holes are provided, and one of the interface holes directly faces one of the interface sockets.

In one of the embodiments, the interface sockets include at least one of a USB-Type-C interface socket, a USB-Type-B interface socket, a TF card interface socket, an audio interface socket, and an HDMI interface socket.

In one of the embodiments, the electronic assembly further comprises a control circuit board, the control circuit board is located outside the protective cavity, and the transformer and the electronic element are both integrated in the control circuit board and electrically connected via the control circuit board.

Beneficial Effects of the Invention

Beneficial Effects

Technical effects of the present application relative to the prior art include: in the power adapter, the protective cavity is formed in the receiving cavity by providing the protective shield, the connector is located inside the protective cavity, and when the plug electrically connected to the connector is plugged into an external socket, the strong AC current is conducted to the connector through the plug; the connector is electrically connected to the transformer, and the transformer can convert the strong AC current of the connector into weak DC current and transmit the weak DC current to the electronic element. Due to the insulation characteristics of the protective shield, it reduces the influence of the strong electrical interference generated by the connector on the electronic assembly which is inside the receiving cavity and outside the protective cavity, thus the safety distance between the electronic assembly and the connector is shortened, so that the space in the receiving cavity can be fully utilized, thereby realizing the small volume setting of the shell, which is convenient to use by a user.

BRIEF DESCRIPTION OF THE DRAWINGS

In order to explain the technical solutions of the embodiments of the present application more clearly, the drawings used in the embodiments of the present application or the description of the prior art will be briefly introduced below. Obviously, the drawings described below are only some embodiments of the present application, and for those of ordinary skill in the art, other drawings can be obtained based on these drawings without involving any inventive effort.

DESCRIPTION OF REFERENCE NUMERALS

Figure 1:
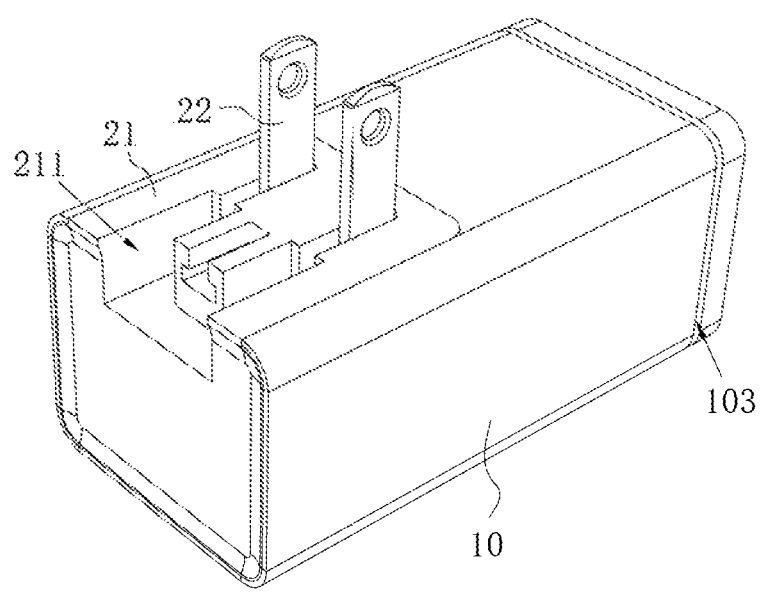
FIG. 1 is a perspective structural view of a power adapter provided by an embodiment of the present application from one perspective.

10. Shell; 101. Interface hole; 102. Plug hole; 103. Heat dissipation hole; 104. Receiving cavity; 20. Plug assembly; 21. Mount; 211. Avoidance groove; 22. Plug; 23. Connector; 231. Plug elastic piece; 30. Protective shield; 301. Protective cavity; 31. Protective shell; 32. Barrier; 40. Electronic assembly; 41. Electronic element; 42. Transformer; 43. Control circuit board; 50. Interface socket; 60. LED lamp bead

DETAILED DESCRIPTION OF EMBODIMENTS

Examples of the Present Invention

Embodiments of the present application will be described below in detail, and examples of the embodiments are shown in the drawings, wherein the same or similar reference numerals represent the same or similar elements or elements having the same or similar functions throughout. The embodiments described below with reference to the accompanying drawings are exemplary and are intended to be illustrative of the present application, and will not be interpreted as limiting the present application.

In the description of the present application, it should be understood that the orientations or positional relationships indicated by the terms "length", "width", "upper", "lower", "front", "rear", "left", "right", "vertical", "horizontal", "top", "bottom", "inside", "outside", etc. are based on the orientations or positional relationships shown in the drawings, and are only for the convenience of describing the present application and simplifying the description, rather than indicating or implying that the device or element referred to must have a specific orientation or be constructed and operated in a specific orientation, and therefore cannot be construed as limiting the present application.

In addition, the terms "first" and "second" are used for descriptive purposes only, and cannot be construed as indicating or implying relative importance or implicitly indicating the number of technical features indicated. Thus, the features defined with "first" and "second" can explicitly or implicitly include one or more of the features. In the description of the present application, the meaning of "a plurality of" is two or more, unless otherwise explicitly and specifically defined.

In the present application, unless otherwise explicitly specified and limited, the terms such as "mount", "connect with", "connect" and "fix" should be broadly understood, for example, they can be a fixed connection or a detachable connection or be integrated; can be a mechanical connection or an electrical connection; and can be directly connected with each other, or can be indirectly connected with each other through an intermediate medium, and can be communication between interiors of two elements or interaction between two elements. For those of ordinary skill in the art, the specific meanings of the above terms in the present application can be understood according to specific situations.

In order to make the object, technical solutions, and advantages of the present application clearer, the present application is described in further detail below with reference to the drawings and embodiments.

Figure 3:
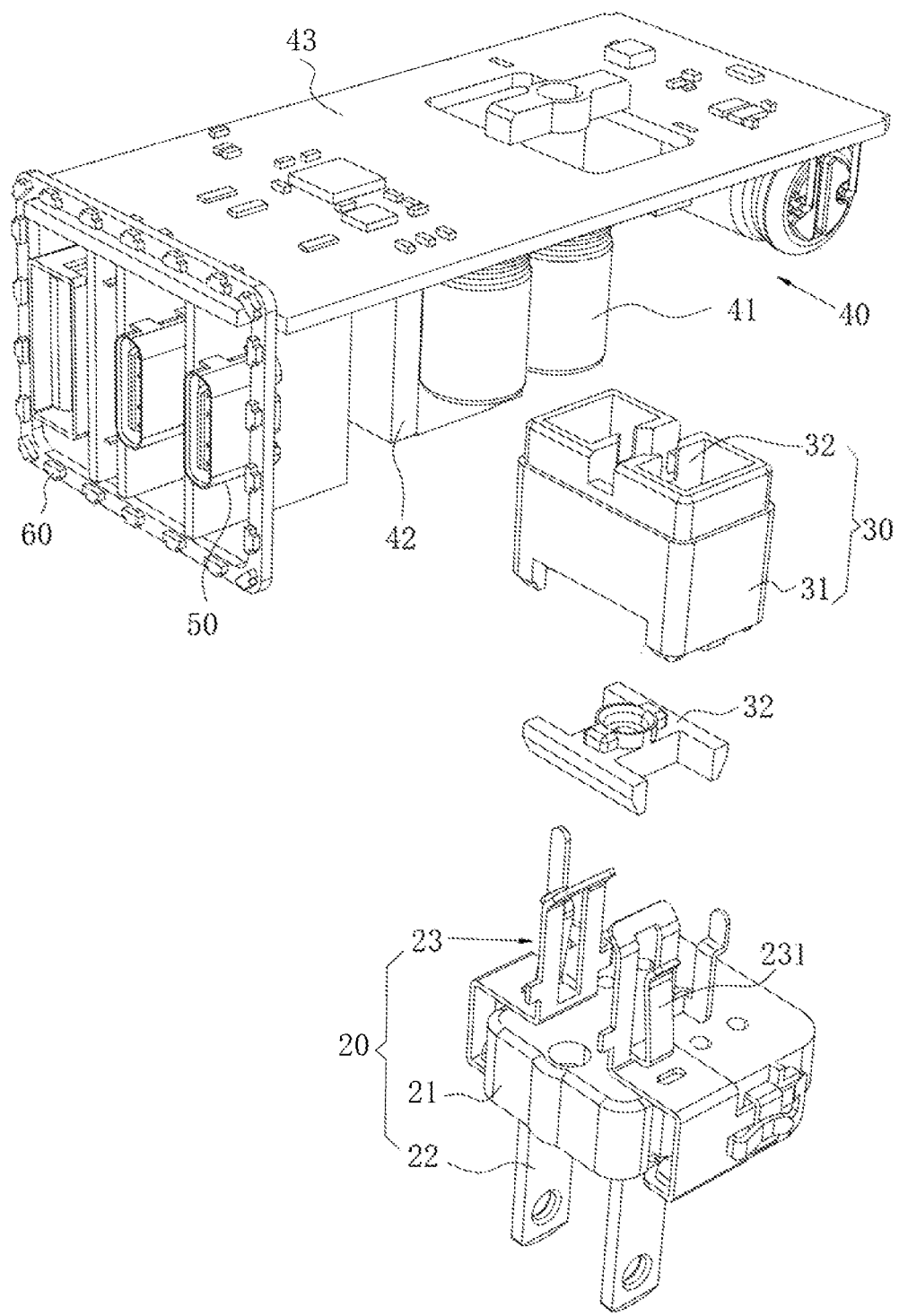
FIG. 3 is an exploded view of a power adapter provided by an embodiment of the present application.

Please refer to FIGS. 1 and 3, the present application provides a power adapter, which comprises a shell 10, a plug assembly 20, an electronic assembly 40, a protective shield 30 and an interface socket 50.

Figure 4:
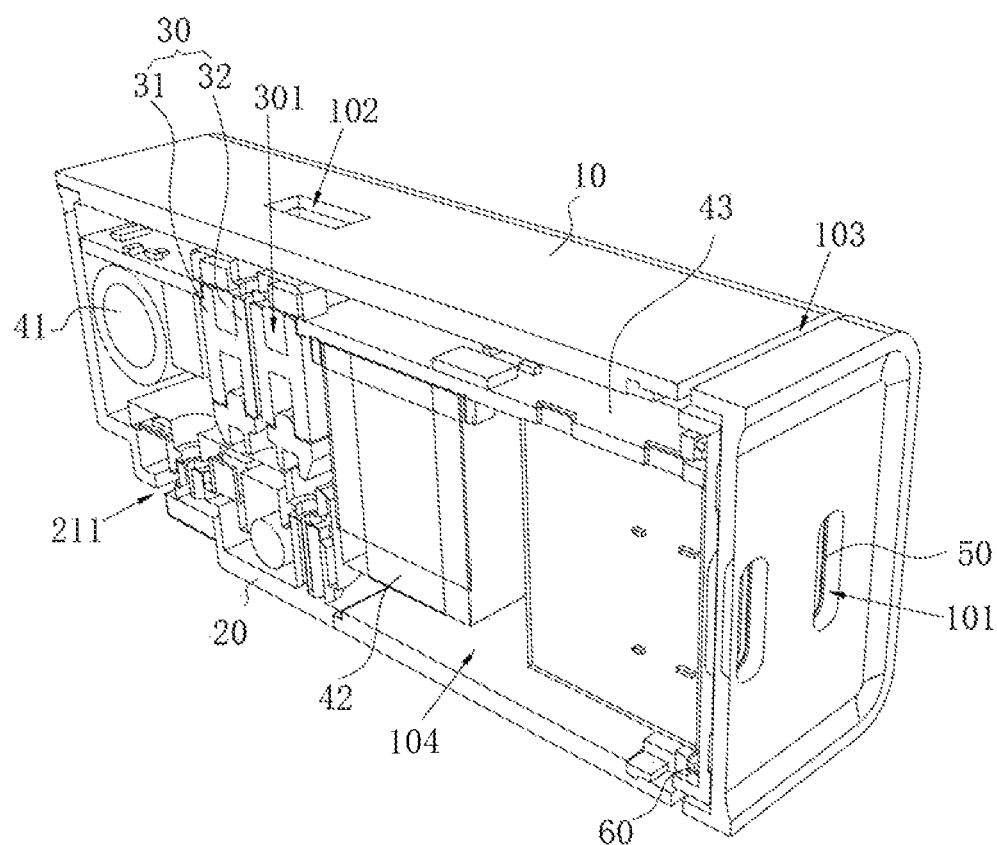
FIG. 4 is a sectional view of a power adapter provided by an embodiment of the present application.

Please refer to FIG. 4, the shell 10 is cylindrical in shape, and its cross section may be polygonal, circular, oval, etc. In this embodiment, the cross section of the shell 10 is square or rectangular, the shell 10 has a receiving cavity 104, the electronic assembly 40, the protective shield 30, a plug socket and the interface socket 50 are all located inside the receiving cavity 104, and the shell 10 is made of a hard insulating material, which plays a protective role in the above structure and can prevent electricity leakage.

Please refer to FIG. 3, the plug assembly 20 comprises a mount 21 connected to the shell 10, a plug 22 connected to the mount 21 and located outside the receiving cavity 104, and a connector 23 connected to the mount 21 and located inside the receiving cavity 104, and the connector 23 is electrically connected to the plug 22. The plug 22 may be a two-phase plug 22 or a three-phase plug 22, and may be a plug 22 that complies with British Standard, European Standard, or American Standard, so as to meet users' different needs. Preferably, the connector 23 and the plug 22 are respectively disposed on both sides of the mount 21, and the plug 22 is rotatably connected to the mount 21 so that the plug 22 can be stored when not in use. Wherein the mount 21 is detachably connected to the shell 10 so as to facilitate the replacement of different types of plugs 22. In order to prevent the stored plug 22 from being bumped, an avoidance groove 211 is formed on the mount 21, an adapter block is arranged on a groove wall of the avoidance groove 211 in a protruding manner, and the plug 22 is rotatably connected to the adapter block and can be accommodated inside the avoidance groove 211 by means of rotation. As such, when the plug 22 is not in use, it can be stored in the avoidance groove 211 by means of rotation to prevent accidental opening, and when it is needed to be used, the plug 22 is rotated out of the avoidance groove 211 to achieve the plug function. At the same time, after the plug 22 is stored in the avoidance groove 211, the avoidance groove 211 and the adapter block can also be used for plugging of other mounts 21 so as to facilitate replacement of different types of plugs 22.

Please refer to FIG. 3, the electronic assembly 40 comprises a control circuit board 43 connected to the shell 10 and located inside the receiving cavity 104, a transformer 42 integrated in the control circuit board 43, and an electronic element 41 integrated in the control circuit board 43, the transformer 42 and the connector 23 are electrically connected via the control circuit board 43, and the transformer 42 is used to convert strong current conducted by the connector 23 into weak current and transmit the weak current to the electronic element 41. Wherein a plurality of electronic elements 41 are provided, which may be capacitors, inductors, or control chips, etc. respectively, so as to implement the power supply function.

Please refer to FIGS. 3 and 4, the protective shield 30 together with a cavity wall of the receiving cavity 104 encloses a protective cavity 301, the connector 23 is located inside the protective cavity 301, and the protective shield 30 is made of an insulating material with a function of isolating strong electrical interference, preferably rigid plastic, to prevent strong current leakage of the connector 23. The control circuit board 43 and the electronic assembly are both located outside the protective cavity 301 to avoid the strong electrical interference.

In the power adapter, the protective cavity 301 is formed in the receiving cavity 104 by providing the protective shield 30, the connector 23 is located inside the protective cavity 301, and when the plug 22 electrically connected to the connector 23 is plugged into an external socket, the strong AC current is conducted to the connector 23 through the plug 22; the connector 23 is electrically connected to the transformer 42, and the transformer 42 can convert the strong AC current of the connector 23 into weak DC current and transmit the weak DC current to the electronic element 41. Due to the insulation characteristics of the protective shield 30, it reduces the influence of the strong electrical interference generated by the connector 23 on the electronic assembly 40 which is inside the receiving cavity 104 and outside the protective cavity 301, thus the safety distance between the electronic assembly 40 and the connector 23 is shortened, so that the space in the receiving cavity 104 can be fully utilized, thereby realizing the small volume setting of the shell 10, which is convenient to use by a user.

Please refer to FIG. 4, the protective shield 30 is in a middle position of the receiving cavity 104, the receiving cavity 104 may be divided into a first chamber and a second chamber by the protective shield 30, the first chamber may communicate with and can also be isolated from the second chamber, and a plurality of electronic elements 41 can be respectively disposed in the first chamber or the second chamber, so that the space in the receiving cavity 104 can be fully utilized. In order to further reduce the strong electrical interference, the transformer 42 is disposed adjacent to the protective shield 30. In addition, two control circuit boards 43 may be provided and disposed in the first chamber and the second chamber, respectively, the control circuit board 43 in the first chamber and the control circuit board 43 in the second chamber may be separately provided or integrally connected to each other for easy installation and production.

Figure 2:
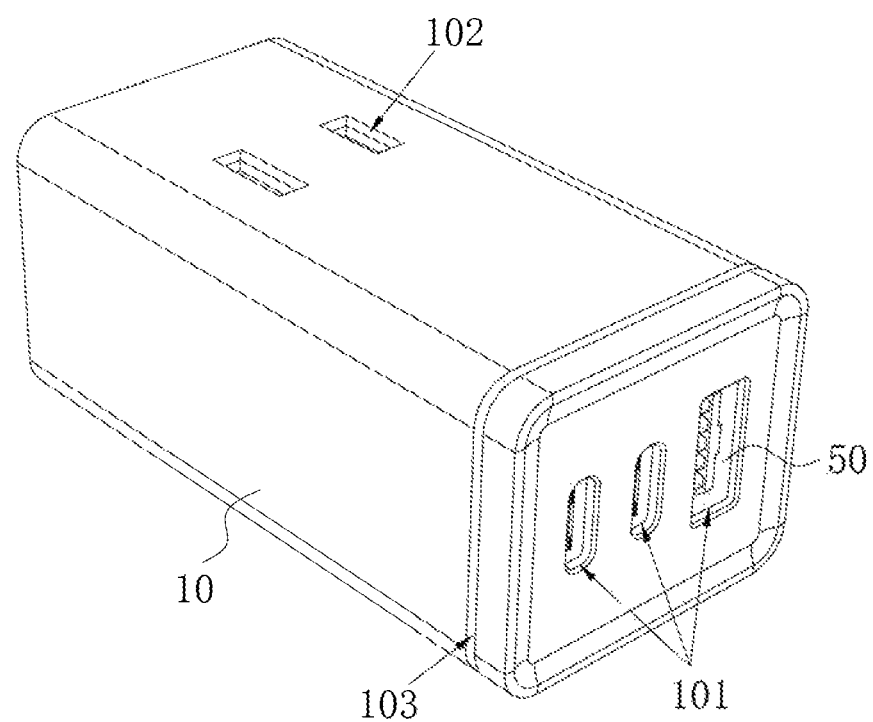
FIG. 2 is a perspective structural view of a power adapter provided by an embodiment of the present application from another perspective.

Please refer to FIGS. 2 and 4, the shell 10 is provided with a plug hole 102 directly facing the connector 23 and penetrating to the protective cavity 301, and an external power interface can be electrically connected to the connector 23 through the plug hole 102 to achieve power supply. To prevent strong electrical interference from an external power connector, the protective shield is circumferentially provided in the plug hole 102 so that the power connector electrically connected to the connector 23 is always located inside the protective cavity 301. The plug hole 102 is adapted to the plug socket, and may be a two-phase plug hole 102 or a three-phase plug hole 102 accordingly.

To ensure the reliability of the connection between the external power connector and the connector 23, the external power connector is plugged into the connector 23. Optionally, the connector 23 comprises an elastic assembly capable of being elastically deformed, and the elastic assembly can elastically abut against the power connector. Please refer to FIG. 3, preferably, taking the power connector being a two-phase connector as an example, the elastic assembly comprises two plug elastic pieces 231, and the two plug elastic pieces 231 can elastically clamp the power connector when plugged by an external power connector to prevent poor contact with the power connector.

Please refer to FIGS. 3 and 4, the protective shield 30 comprises a cylindrical protective shell 31 and a barrier 32 connected to the protective shell 31, two extended ends of the protective shell 31 are respectively connected to the mount 21 and the cavity wall of the receiving cavity 104 opposite the mount 21, the protective shell 31 together with the mount 21 and the cavity wall of the receiving cavity 104 encloses the protective cavity 301 to ensure the tightness of the protective cavity 301, the barrier 32 is located inside the protective cavity 301 and divides the protective cavity 301 into at least two partitioned cavities, and one plug elastic piece 231 is located in one partitioned cavity. As such, no electrical signal interference or accidental short circuit occurs between the two plug elastic pieces 231.

Please refer to FIGS. 1 and 3, the interface socket 50 is used for being plugged by an external data cable connector to provide power or data transmission through a data cable. The interface socket 50 is electrically connected to the electronic element 41 via the control circuit board 43, the shell 10 is also provided with an interface hole 101 directly facing the interface socket 50, and the external data cable connector can pass through the interface hole 101 and be electrically plugged into the interface socket 50. In order to improve the applicability of the power adapter, a plurality of interface sockets 50 and interface holes 101 are provided, and one interface hole 101 directly faces one interface socket 50. The plurality of interface sockets 50 may be one of a USB-Type-C interface socket 50, a USB-Type-B interface socket 50, a TF card interface socket 50, an audio interface socket 50, and an HDMI interface socket 50, respectively.

Please refer to FIGS. 1, 2 and 3, in order to be convenient for the user to identify the type and position of the interface socket 50 in a dim environment, an LED lamp bead 60 may be provided on the shell 10. In order to facilitate heat dissipation, a heat dissipation adhesive for absorbing heat of the electronic assembly 40 is disposed in the receiving cavity 104, and a heat dissipation hole 103 for heat dissipation is also disposed in the shell 10.

The above embodiments are merely preferred embodiments of the present application, only the technical principles of the present application are specifically described, and these descriptions are only for explaining the principles of the present application and cannot be interpreted in any way as limiting the scope of protection of the present application. Based on the explanation herein, any modifications, equivalent replacements, and improvements made within the spirit and principles of the present application, and other specific implementations of the present application conceived by those skilled in the art without involving any inventive effort should be included within the scope of protection of the present application.

The invention claimed is:

1. A power adapter comprising:
   a shell, defining a receiving cavity;
   a plug assembly, comprising a plug connected to the shell and located outside the receiving cavity, and a connector electrically connected to the plug and located inside the receiving cavity;
   an electronic assembly, comprising a transformer connected to the shell and located inside the receiving cavity, and an electronic element electrically connected to the transformer, wherein the transformer is electrically connected the connector and reduce current conducted by the connector to be transmitted to the electronic element; and
   a protective shield comprising a cylindrical protective shell, located inside the receiving cavity and enclosing a protective cavity together with a cavity wall of the receiving cavity, wherein the connector is located inside the protective cavity, the electronic assembly is located outside the protective cavity, and the protective shield comprises insulating material.

2. The power adapter of claim 1, wherein the protective shield is made of a plastic material.

3. The power adapter of claim 1, wherein the receiving cavity is divided into a first chamber and a second chamber by the protective shield, wherein the electronic element includes a plurality of electronic elements respectively disposed in the first chamber or the second chamber.

4. The power adapter of claim 1, wherein the electronic element comprises at least one of a capacitor, an inductor and a control chip.

5. The power adapter of claim 1, wherein the plug assembly further comprises a mount connected to the shell, the connector and the plug are respectively disposed on both sides of the mount, and the plug is rotatably connected to the mount.

6. The power adapter of claim 5, wherein the mount is detachably connected to the shell.

7. The power adapter of claim 5, wherein an avoidance groove is formed on an outer wall of the mount, an adapter block is arranged on a groove wall of the avoidance groove in a protruding manner, and the plug is rotatably connected to the adapter block and can be accommodated inside the avoidance groove by means of rotation.

8. The power adapter of claim 5, wherein the shell is provided with a plug hole directly facing the connector and penetrating to the protective cavity, the protective shield is circumferentially provided in the plug hole, and the plug hole is used for an external power interface to pass through to electrically connect to the connector.

9. The power adapter of claim 8, wherein the connector comprises an elastic assembly capable of being elastically deformed, the elastic assembly comprises at least two plug elastic pieces, and the plug elastic pieces are used for being elastically plugged by and external power connector.

10. The power adapter of claim 9, wherein the protective shield further comprises a barrier connected to the protective shell, two extended ends of the protective shell are respectively connected to the mount and the cavity wall of the receiving cavity opposite the mount, the protective shell together with the mount and the cavity wall of the receiving cavity encloses the protective cavity, the barrier is located inside the protective cavity and divides the protective cavity into at least two partitioned cavities, and one of the plug elastic pieces is located in one of the partitioned cavities.

11. The power adapter of claim 8, wherein the plug hole is a two-phase plug hole or a three-phase plug hole.

12. The power adapter of claim 1, wherein the power adapter further comprises an interface socket connected to the shell and located inside the receiving cavity, the interface socket is electrically connected to the electronic element, the shell is further provided with an interface hole directly facing the interface socket, and the interface hole is used for an external data cable connector to pass through such that same is electrically plugged into the interface socket.

13. The power adapter of claim 12, wherein a plurality of interface sockets and a plurality of interface holes are provided, and one of the interface holes directly faces one of the interface sockets.

14. The power adapter of claim 13, wherein the interface sockets include at least on of the USB-Type-C interface socket, a USB-Type-B interface socket, a TF card interface socket, an audio interface socket, and an HDMI interface socket.

15. The power adapter of claim 1, wherein the electronic assembly further comprises a control circuit board, the control circuit board is located outside the protective cavity, and the transformer and the electronic element are both integrated in the control circuit board and electrically connected via the control circuit board.

* * * * *